US012808654B2

(12) United States Patent
Zhang et al.

(10) Patent No.: US 12,808,654 B2

(45) Date of Patent: Nov. 24, 2026

(54) FLATNESS PRECISION IMPROVEMENT WITH SYSTEMATIC ERROR REDUCTION VIA INDUCED WAFER TILT VARIATION

(71) Applicant: KLA Corporation, Milpitas, CA (US)

(72) Inventors: Taishi Zhang, Singapore (SG); Wenjiang Guo, Singapore (SG)

(73) Assignee: KLA Corporation, Milpitas, CA (US)

( * ) Notice: Subject to any disclaimer, the term of this patent is extended or adjusted under 35 U.S.C. 154(b) by 120 days.

(21) Appl. No.: 18/590,913

(22) Filed: Feb. 28, 2024

(65) Prior Publication Data

US 2025/0271251 A1 Aug. 28, 2025

(51) Int. Cl.

*G01B 9/02061* (2022.01)
*G01B 9/02* (2022.01)
*G01B 11/00* (2006.01)
*H10P 74/20* (2026.01)

(52) U.S. Cl.

CPC ..... *G01B 9/02061* (2013.01); *G01B 9/02083* (2013.01); *G01B 11/002* (2013.01); *H10P 74/203* (2026.01)

(58) Field of Classification Search

CPC .................................................. G01B 9/02063
See application file for complete search history.

(56) References Cited

U.S. PATENT DOCUMENTS 5,432,606 A 7/1995 Noguchi et al.
5,729,343 A * 3/1998 Aiyer ................ G01B 11/0675 356/504
7,595,891 B2 9/2009 Tang
7,616,324 B2 * 11/2009 Yamauchi .......... G01B 11/2441 356/511
2004/0263840 A1 * 12/2004 Segall .................... G01B 11/02 356/243.1
2007/0058174 A1 * 3/2007 Hill ........................... G01J 9/02 356/512
2016/0161730 A1 * 6/2016 Nakamura ............ G01B 11/14 356/498
2017/0003120 A1 * 1/2017 Bean ................. G01B 9/02032
2023/0213334 A1 7/2023 Laplante et al.

FOREIGN PATENT DOCUMENTS

JP H0755970 B2 * 6/1995
JP H09218017 A 8/1997
JP 2001033215 A 2/2001
WO 2007091087 A2 8/2007

OTHER PUBLICATIONS

WIPO, International Search Report and Written Opinion issued in International Application No. PCT/US2025/015449, May 21, 2025.

* cited by examiner

*Primary Examiner* — Michael A Lyons
(74) *Attorney, Agent, or Firm* — Hodgson Russ LLP

(57) ABSTRACT

A workpiece is placed on a stage in an interferometer. Measurements of the workpiece are taken using the interferometer. A random two-dimensional tilt is applied to the workpiece before each of the measurements using at least one tilt motor. A stage is configured to hold a workpiece in a path of the beam of light from a beam splitter. The tilt motor is connected with the stage and randomly move the stage in two dimensions before a measurement.

18 Claims, 12 Drawing Sheets

FLATNESS PRECISION IMPROVEMENT WITH SYSTEMATIC ERROR REDUCTION VIA INDUCED WAFER TILT VARIATION

FIELD OF THE DISCLOSURE

This disclosure relates to error reduction during workpiece metrology.

BACKGROUND OF THE DISCLOSURE

Interferometers are used as metrology tools, where workpiece surface information is encoded in the phase of interferogram. Interferometers are commonly used in the semiconductor industry to measure aspects of semiconductor wafers. Typical error sources, such as light intensity variation, wafer vibration, detector response linearity, or imperfection of a phase extraction algorithm, can leave interferogram-like error patterns on a decoded wafer surface map. This affects precision of flatness metrics such as site front least squares range (SFQR). An exemplary process to determine SFQR is shown in FIG. 1.

Due to the interferogram nature of raw data, error is encoded in the form of interferogram fringes. This error can be printed into downstream maps, such as a thickness map. This is referred as fringe print-through (FPT) error and is an error source that affects precision with several critical metrics such as SFQR. This is shown in FIG. 2.

Several methods have been implemented to address the FPT issue. One example is averaging in which multiple measurements have been done consecutively. Thus, the measurement noise may be suppressed. In principle, the noise suppression effect should hold a square root relation with the number of measurements following the law of large numbers. However, the precision was not improved because there is a gap between the theoretical square root law limit and real performance (Measurement 1 and Measurement 2), as shown in FIG. 3. In the formula shown below, besides the variance terms (Var), there are also covariance terms (Cov). The covariance terms present covariance between any two measurements. For two measurements completely independent of each other, the covariance terms are approaching zero. Thus, variance of N-averaged measurement is N-times reduced compared with the variance of the baseline. However, this is not true in experiments because the averaging is done across all measurements sharing the same load, which are correlated with positive covariance. All measurements carry a similar pattern of error and the error becomes a systematic error that cannot be averaged out with more measurements. The correlation by shared load involves changes including location, tilt, and workpiece shape. The correlation may need to be broken to improve precision close to a theoretical limit. x is a general variable and can represent any measurement. $x_1$, $x_2$ . . . , $x_n$ is with multiple repeats.

$$\mathrm{Var}(\overline{x}) = \mathrm{Var}\left(\frac{1}{n}(x_1 + x_2 + \cdots + x_n)\right) = \frac{1}{n^2}\mathrm{Var}(x_1 + x_2 + \cdots + x_n) = \frac{1}{n^2}\Big(\mathrm{Var}(x_1) + \mathrm{Var}(x_2) + \cdots + \mathrm{Var}(x_n) + \mathrm{Cov}(x_1, x_2) + \cdots + \mathrm{Cov}(x_1, x_n) + \cdots \geq \frac{1}{n^2}\cdot n\cdot \mathrm{Var}(x_i) \geq \frac{\mathrm{Var}(x_i)}{n}\Big)$$

Consequently, taking multiple measurement for an average tends to not reduce error. Using a central limit theorem, precision could be improved following the inverse square root trend of measurement numbers. However, such ideal trend is never reached. A large portion of the error is systematic error, such as a system error in the interferogram pattern related to a loading position. Simply taking more averages is generally not effective because it reduces random error without reducing systematic error. Improved systems and techniques are needed.

BRIEF SUMMARY OF THE DISCLOSURE

An interferometer is provided in a first embodiment. The interferometer includes a light source that generates a beam of light; a beam splitter in a path of the beam of light; a reference flat in a path of the beam of light from the beam splitter; a stage configured to hold a workpiece in a path of the beam of light from the beam splitter; a detector configured to receive light from the workpiece; a processor in electronic communication with the detector; and a tilt motor connected with the stage. The tilt motor is configured to randomly move the stage in two dimensions before a measurement. The workpiece may be a semiconductor wafer.

The interferometer can include a second tilt motor connected with the stage. The second tilt motor works in conjunction with the tilt motor to randomly move the stage in two dimensions before the measurement.

The processor can be configured to average a plurality of measurements in information received from the detector. Each of the measurements uses a different position of the stage in the two dimensions.

A method is provided in a second embodiment. The method includes disposing a workpiece on a stage in an interferometer and taking a plurality of measurements of the workpiece using the interferometer. A random two-dimensional tilt is applied to the workpiece before each of the measurements using at least one tilt motor. The workpiece may be a semiconductor wafer.

The random two-dimensional tilt can be applied using two of the tilt motors.

The method can include averaging the measurements using a processor.

A non-transitory computer-readable storage medium is provided in a third embodiment. The non-transitory computer-readable storage medium includes one or more programs for executing the following steps on one or more computing devices. In a first step, instructions are sent to at least one tilt motor to apply a random two-dimensional tilt to a stage with a workpiece disposed thereon. In a second step, instructions are sent to measure the workpiece using an interferometer after the random two-dimensional tilt is applied to the stage. The first step and the second step to generate a plurality of the measurements. The workpiece may be a semiconductor wafer.

The steps can further include averaging the measurements.

The first step can further include sending instructions to a second tilt motor to apply the random two-dimensional tilt.

In these embodiments, a tilt of the workpiece is less than 1 mm.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein reduce the system error of a workpiece (e.g., a semiconductor wafer) surface measurement in the form of fringe print-through (FPT), which cannot be resolved by simply taking an average of more measurements. By using one or more tilt motors, a predefined randomly selected 2D wafer tilt is added to each measurement before determining the average. In this way, the system error correlated with the interferogram pattern becomes random error, which can be more effectively reduced via averaging under the central limit theorem. Using the tilt motor to introduce randomness in a loading position converts a system error into random error. This can reduce system error in an interferometric surface measurement without complicated hardware changes.

Figure 4:
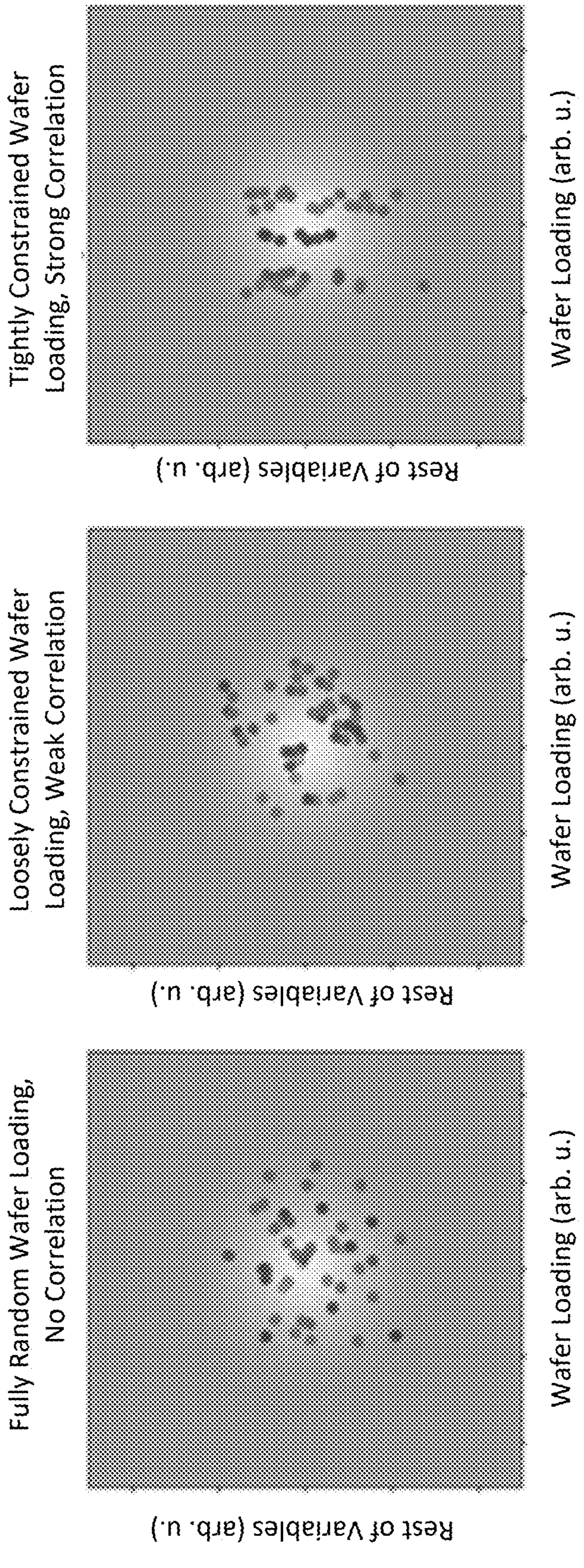
FIG. 4 shows sampling for averaging with different techniques, wherein the scale on each plot is the same.
Figure 5:
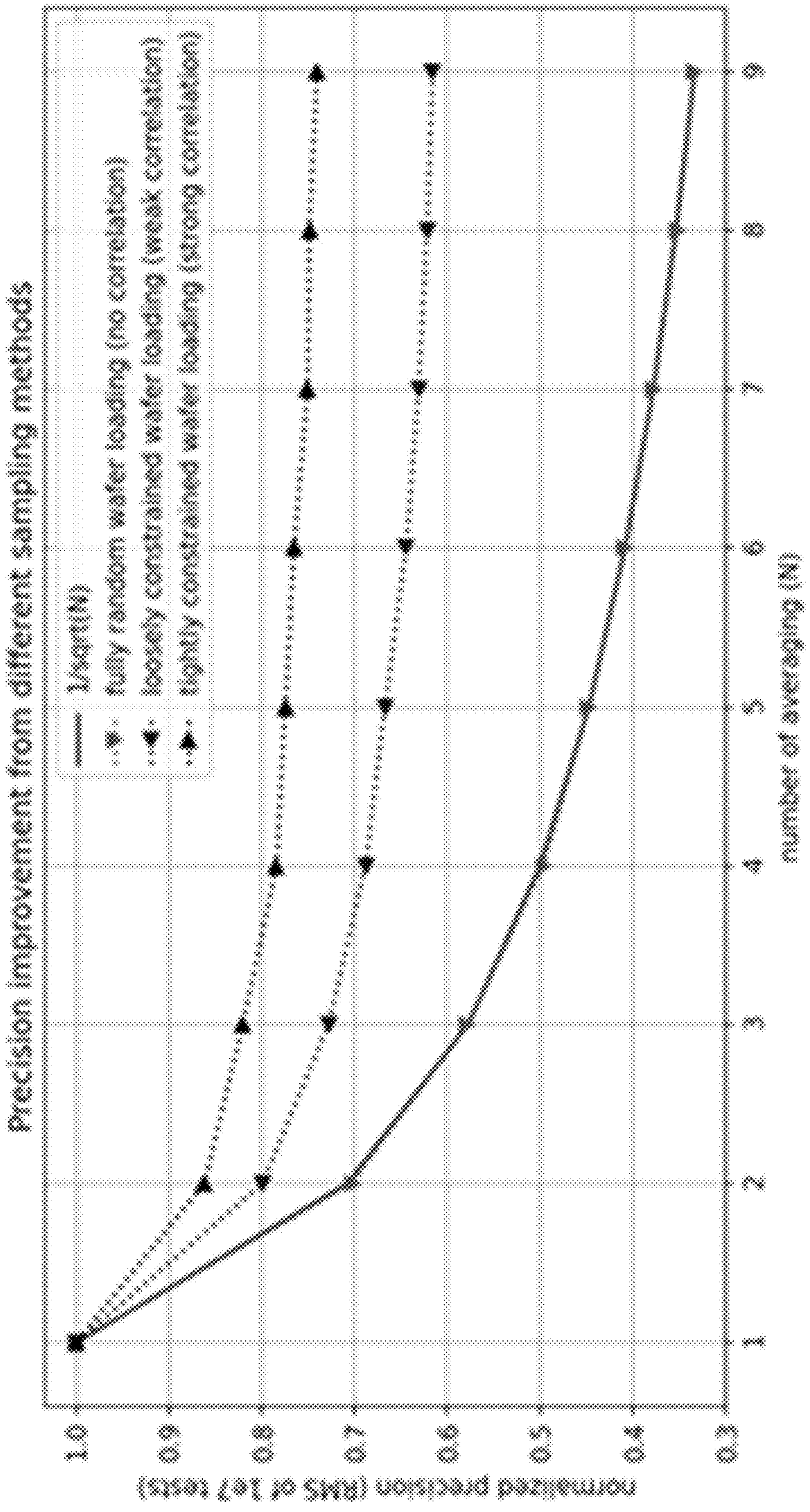
FIG. 5 is a chart demonstrating improvement from different sampling methods.

Improvements can be demonstrated. First, a simulation illustrates why correlated measurements induce a less efficient precision improvement. Assume an arbitrary function f(x,y) where both x,y follow normal distribution. Here, x could represent workpiece loading while y could represent all other variables for workpiece measurement. Consider three situations: 1) both x and y can be randomly sampled; 2) y can be randomly sampled but x is loosely correlated; and 3) y can be randomly sampled but x is strongly correlated. f(x,y) can be calculated N times to get the N-average, which is repeated five times for a five-measurement standard deviation. Theoretically the standard deviation of the averaged value should follow 1/sqrt (N) trend with respect to the average number N. In the simulation, this may only be true when x, y are both randomly chosen. For situations where x is correlated, the descending of the standard deviation is slower. The stronger the correlation, the slower the descending. This is shown in FIG. 4 and FIG. 5.

Figure 6:
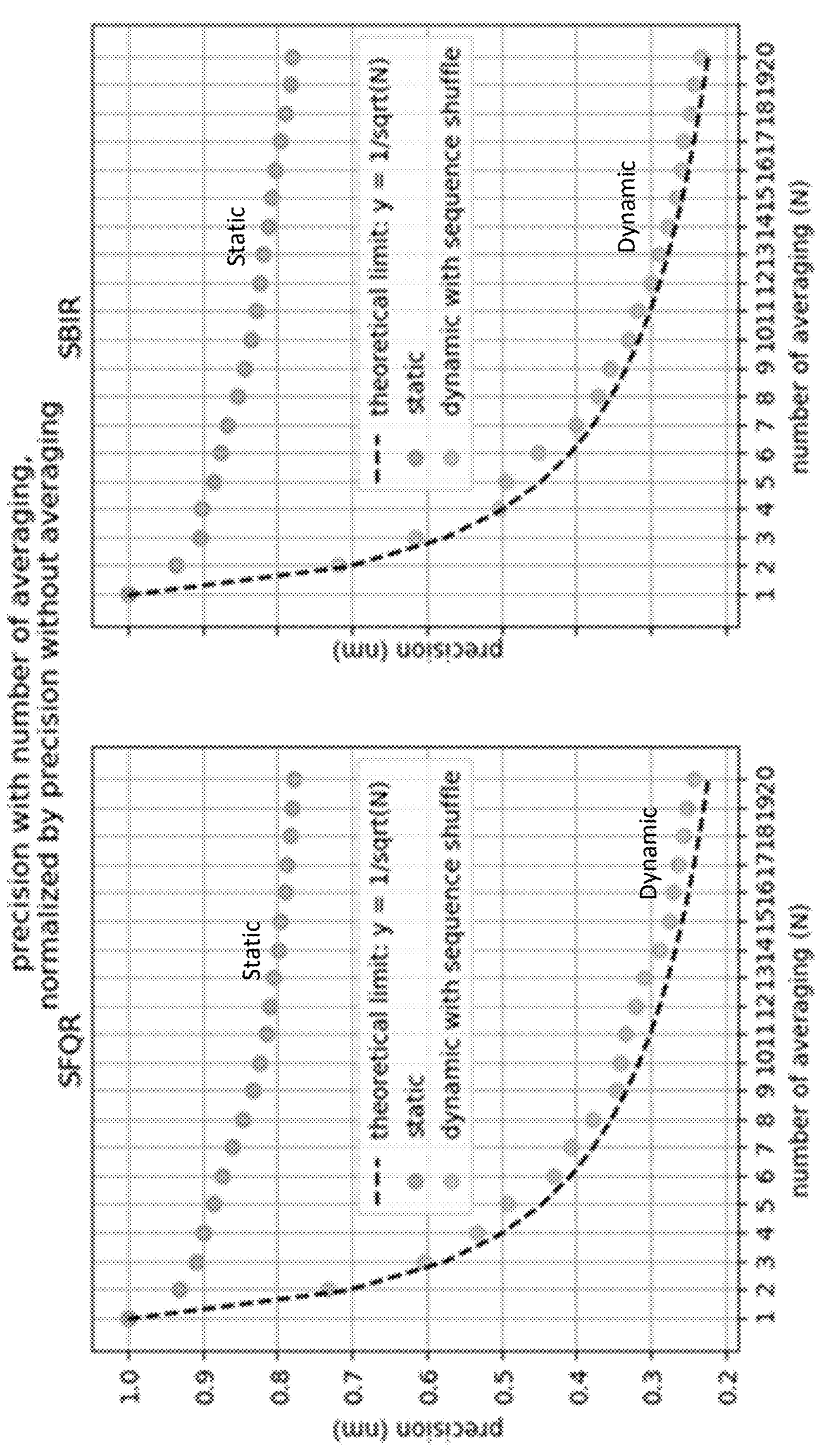
FIG. 6 includes charts showing precision with the number of averaging normalized by precision without averaging for SFQR and site back ideal range (SBIR)

The concept also can be demonstrated by changing wafer loading sequence during data measurement. The default averaging method is called static averaging and all the measurements to be averaged share the same loading sequence. Its precision improvement can be less efficient than theoretical. To demonstrate that sharing the same wafer loading is a root cause, another dynamic averaging method is tested. Each measurement to be averaged has its unique wafer loading with the same measurement sequence shuffle (to completely break any correlation dependent on time). An efficient averaging in good agreement with theoretical curve was observed, which is shown in FIG. 6 for SFQR and SBIR.

Figure 7:
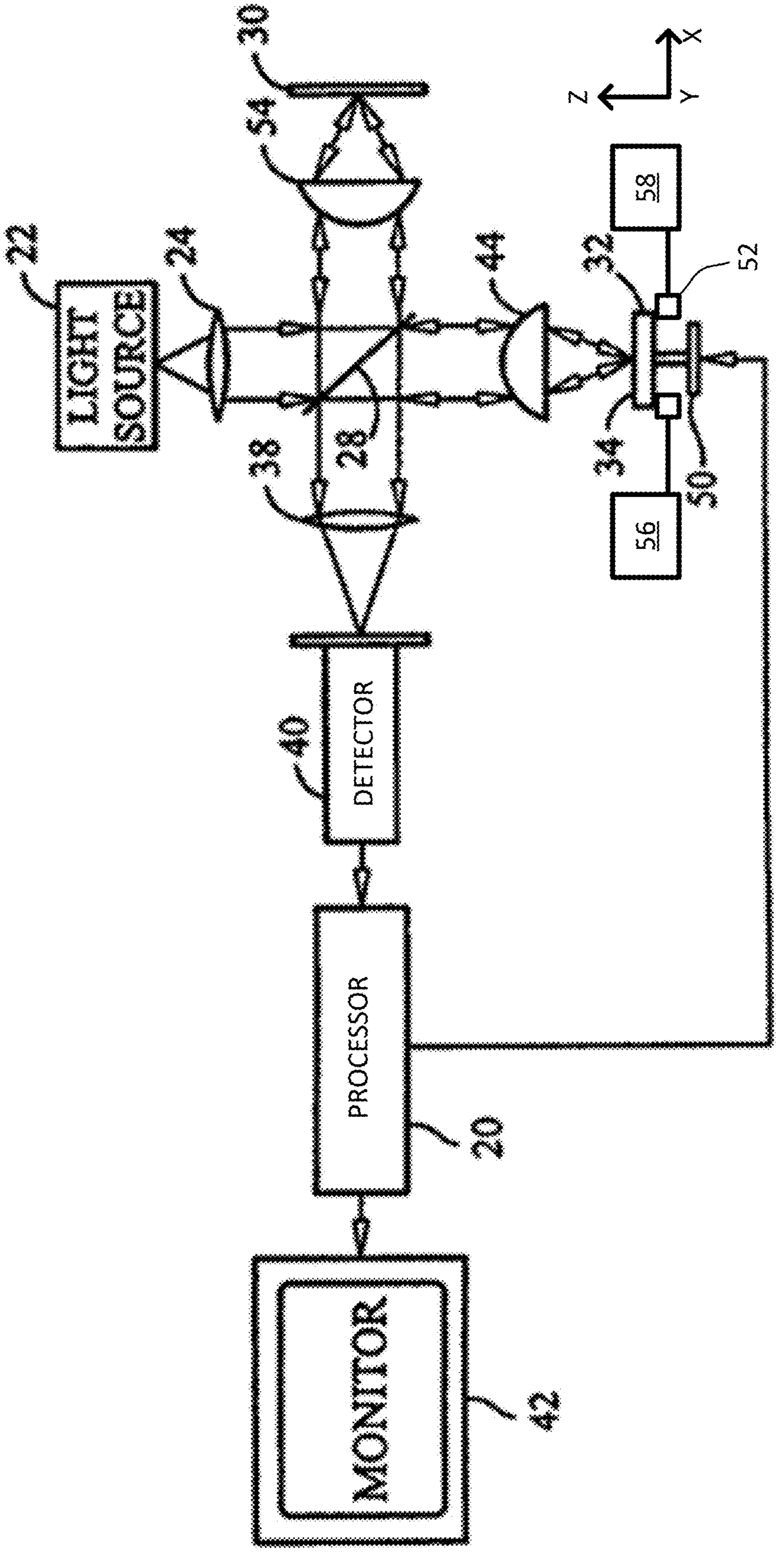
FIG. 7 is an embodiment of an interferometer in accordance with the present disclosure.

FIG. 7 is an interferometer that can improve precision. While a Michelson interferometer is illustrated, the embodiments disclosed herein can apply to any other type of interferometer, such as a Fizeau, Mirau, Linnik, or Twyman-Green interferometer.

As shown in FIG. 7, the interferometer is controlled by a processor 20, which coordinates the operation of a white light or incoherent light source 22 with other components of the system. The white light from the source 22 is supplied through a collimating lens 24 to a beam splitter 28 along the path of the light, from which the light is separated into two paths. One path goes to a reference flat 30 and the other path goes to the workpiece 32.

The reflected light beams from both the topmost surface 34 and underneath surfaces of the workpiece 32 are directed by the beam splitter 28 to an imaging lens 38, which supplies, simultaneously, multiple interferograms to a detector 40, such as a CCD camera. The detector 40 additionally may include a frame grabber (not shown) for storing images detected by the detector or the processor 20 may be configured to provide this function. The images obtained by the detector 40 are supplied to the processor 20 for processing to produce the desired profiles in a suitable form for display on a monitor 42 or for storage for subsequent utilization.

The processor 20 can provide the step-by-step positioning for each frame of analysis in synchronization with the operation of the detector 40 using a suitable pusher or drive mechanism 50. The pusher mechanism 50 is illustrated in FIG. 7 as moving the workpiece 32 toward and away from the reference flat 30. A piezo-electric pusher, pneumatic pusher, or other suitable mechanical pusher may be employed for this purpose.

Figure 1:
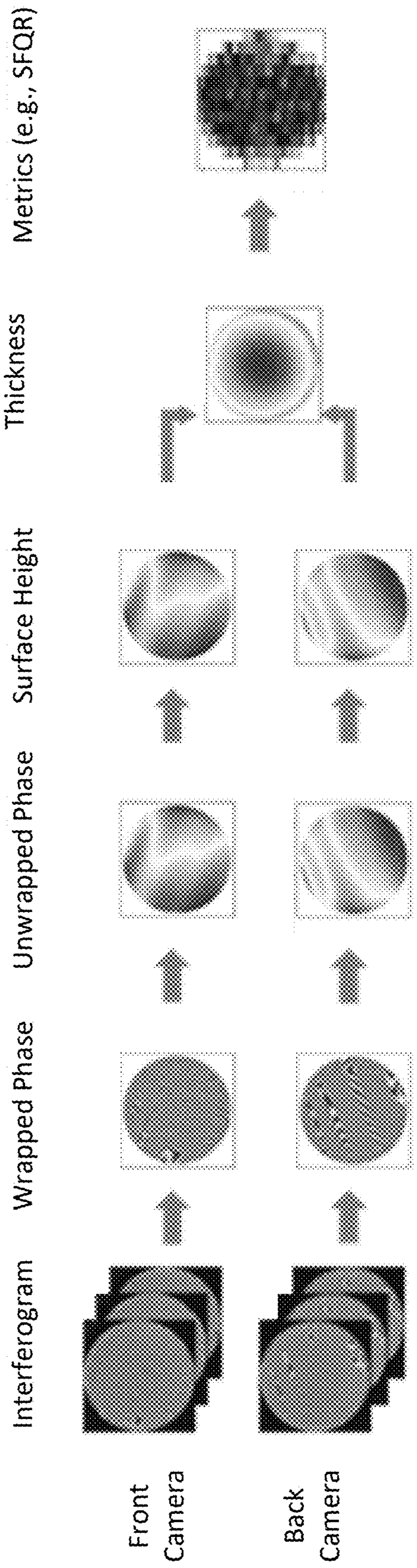
FIG. 1 (PRIOR ART)
FIG. 1 is a diagram of an exemplary process to determine SFQR.
Figure 2:
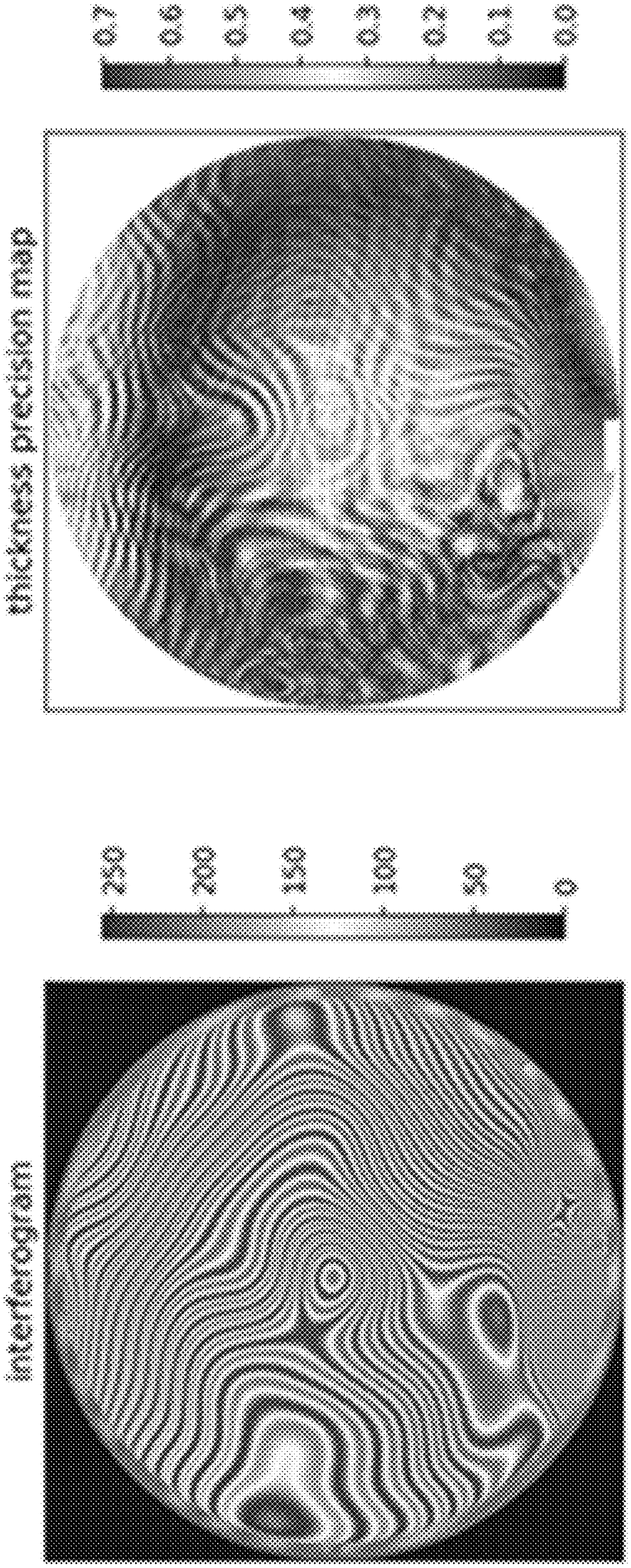
FIG. 2 (PRIOR ART)
FIG. 2 shows an exemplary interferogram and corresponding thickness precision map.
Figure 3:
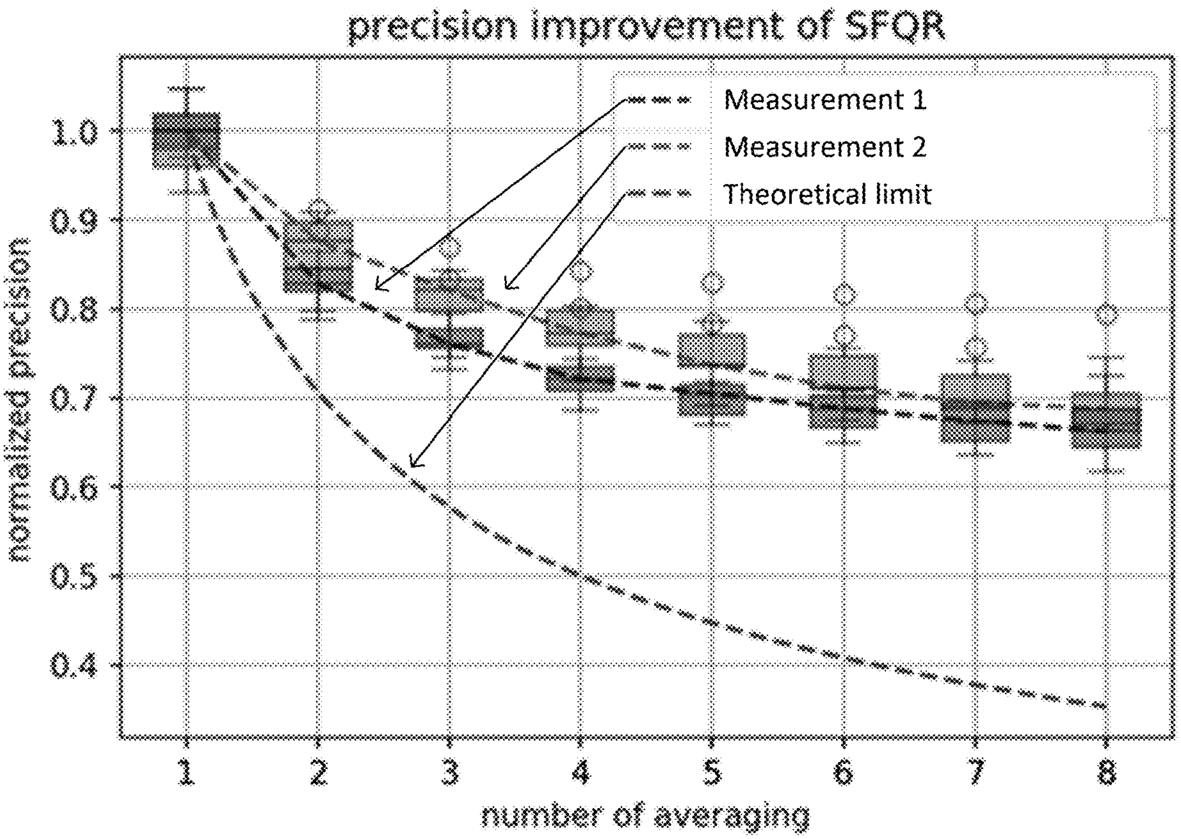
FIG. 3 (PRIOR ART)
FIG. 3 is a chart of experimental measurements demonstrating effectiveness of averaging with respect to normalized precision.

Processor 20 is coupled to elements of the interferometer. Processor 20 typically comprises a programmable processor, which is programmed in software and/or firmware to carry out the functions that are described herein, along with suitable digital and/or analog interfaces for connection to the other elements of the interferometer. Alternatively or additionally, processor 20 comprises hard-wired and/or programmable hardware logic circuits, which carry out at least some of the functions of the processor 20. Although processor 20 is shown in FIG. 3, for the sake of simplicity, as a single, monolithic functional block, in practice the processor 20 may comprise multiple, interconnected control units, with suitable interfaces for receiving and outputting the signals that are illustrated in the figures and text herein. Program code or instructions for the processor 20 to implement various methods and functions disclosed herein may be stored in readable storage media, such as a memory.

It should be noted that instead of moving the workpiece 32 with respect to the reference flat 30, the pusher 50 can be mechanically coupled (by a coupling not shown) to the reference flat 30 to move that surface relative to the surfaces of the workpiece 32. Either the workpiece 32 or the reference flat 30 may be moved in parallel planes with respect to one another to produce the repeated measurements or vertical scanning for each of the positions over which the complete scan is made.

The interferometer of FIG. 7 uses identical microscope objective lenses, with the lens 44 being duplicated by another lens 54 provided with inputs from the beam splitter 28. The lens 54 then focuses on a reference flat (mirror) 30, whereas the lens 44 is used to focus on the workpiece 32. The reflected images are gathered and supplied by the beam splitter 28 to the imaging lens 38 for the detector 40. The processor 20 then processes the information.

The workpiece 32 is positioned on a stage 52. The stage 52 positions the workpiece 32 in a path of the beam of light from the beam splitter 28. The stage 52 is connected with at least a tilt motor 56. The stage 52 also can be connected with a second tilt motor 58. Both the tilt motor 56 and the tilt motor 58 are configured to randomly move the stage 52 in two dimensions before a measurement using the interferometer. The two dimensions can be pitch and yaw direction along optical axis. If the beam is defined as the z direction, the workpiece 32 can be tilted in x and y direction. The x and y directions are perpendicular. In an embodiment, only the tilt motor 56 is used. In another embodiment, both the tilt motor 56 and the tilt motor 58 work in conjunction to randomly move the stage 52. The tilt motor 56 and tilt motor 58 can be along orthogonal directions, to control workpiece 32 tilt in x and y direction, respectively, because wafer interferogram is two dimensional. In an instance, the tilt motor 56 and tilt motor 58 are positioned in the x-y plane of the stage 52 and move the stage 52 (and, thus, the workpiece 32) to tilt along x and y, respectively The amount to random movement is determined by the loading repeatability of the workpiece 32 by external parts (e.g., a robot handler) and repeatability of the tilt motor 56 and second tilt motor 58. For example, if the workpiece 32 is loaded onto stage 52 via an external robot handler with tilt following distribution (x_mean, x_std) nm/mm statistically, then the tilt motors 56 and 58 are assigned a few targeted tilt amount y nm/mm which follows normal distribution N(x_mean, x_std). Considering the tilt motor itself has repeatability z nm/mm, the actual amount is (y+z) nm/mm.

The maximum amount to adjust/tilt can depend on the loading repeatability of workpiece 32 and the tilt motor being tilted at same range of the loading repeatability. There may be no real time compensation for the random movement. The randomness can be desired to break the systematic error. Unexpected spikes or outliers that can affect the outcome are generally rare during normal operation.

The tilt motor 56 and the tilt motor 58 can move the stage 52 such that the associated workpiece 32 tilts by a few 10 s of nm or mm, which can result in a few μm in yaw or pitch. This can provide the perturbation for the improvements in measurements. For example, demonstrated with a 20-tilt measurement, workpiece tilt shows a large variation as compared with the measurement using fixed workpiece tilt. Such workpiece tilt results in a variation in interferogram patterns, shown in FIG. 8.

Using fixed wafer tilt, the multiple repeated measurements has an inter-quartile range (IQR)<2 nm/mm, and this can be seen from the consistent interferogram fringe pattern. With extra motor-induced workpiece tilt, the IQR could reach 5 nm/mm, and reflecting more varying interferogram fringe pattern. Therefore, the fixed pattern (i.e., systematic error embedded) is changed to a random pattern (and random error embedded) and can be reduced by taking average of more measurements.

Figure 8:
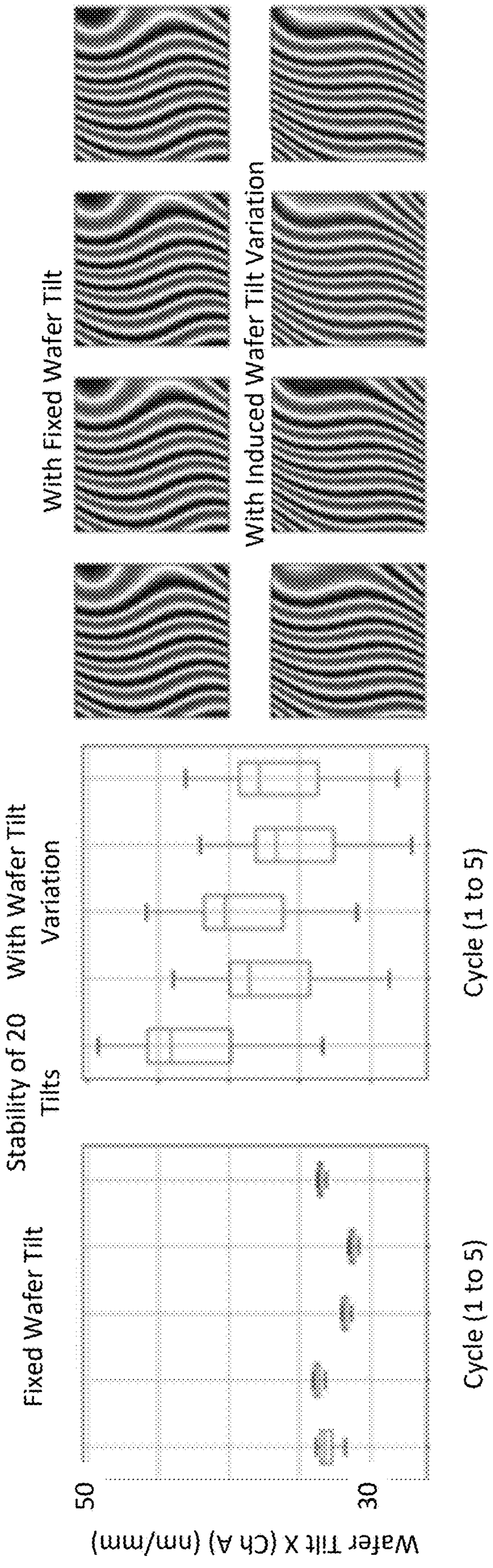
FIG. 8 shows results associated with random movement in two dimensions in accordance with the present disclosure.
Figure 9:
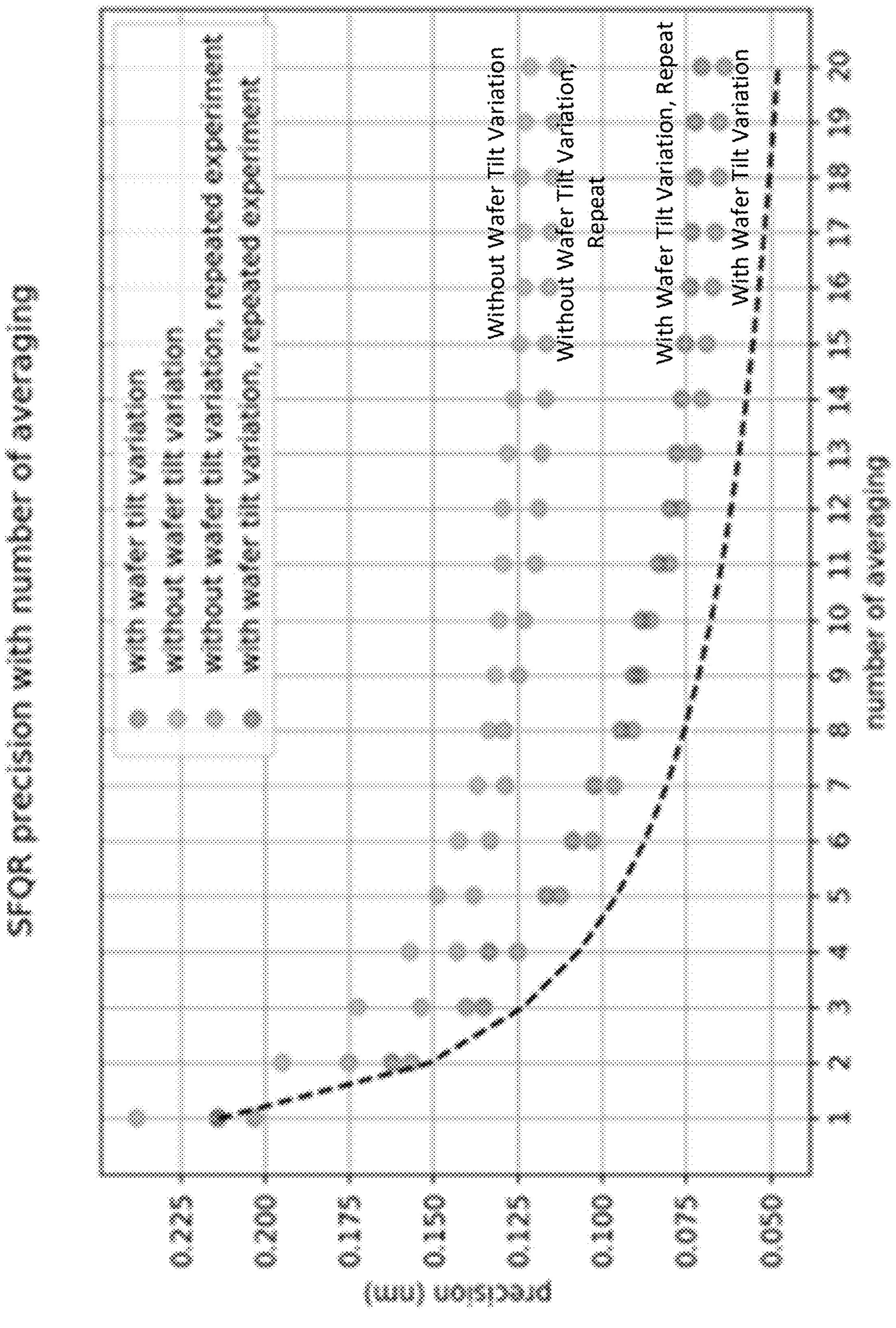
FIG. 9 shows a chart showing precision improvements using an embodiment in accordance with the present disclosure.

With workpiece tilt variation induced using an embodiment disclosed herein, SFQR precision improvement was demonstrated in back-to-back experiments as shown in the chart of FIG. 9, which corresponds to the tilt setup in FIG. 8. The precision improvement is closer to theoretical limit after workpiece tilt variation is induced. This is a A-B-B-A test to confirm the result, where A represents test with motor-induced wafer tilt variation (corresponds to same label in FIG. 8), and B represents test without wafer tilt variation (corresponds to the "fixed wafer tilt" label in FIG. 8). The repeated test suggests the motor-induced wafer tilt variation may make precision improvement/noise reduction closer to the square root rule, marked by dashed curve.

Figure 10:
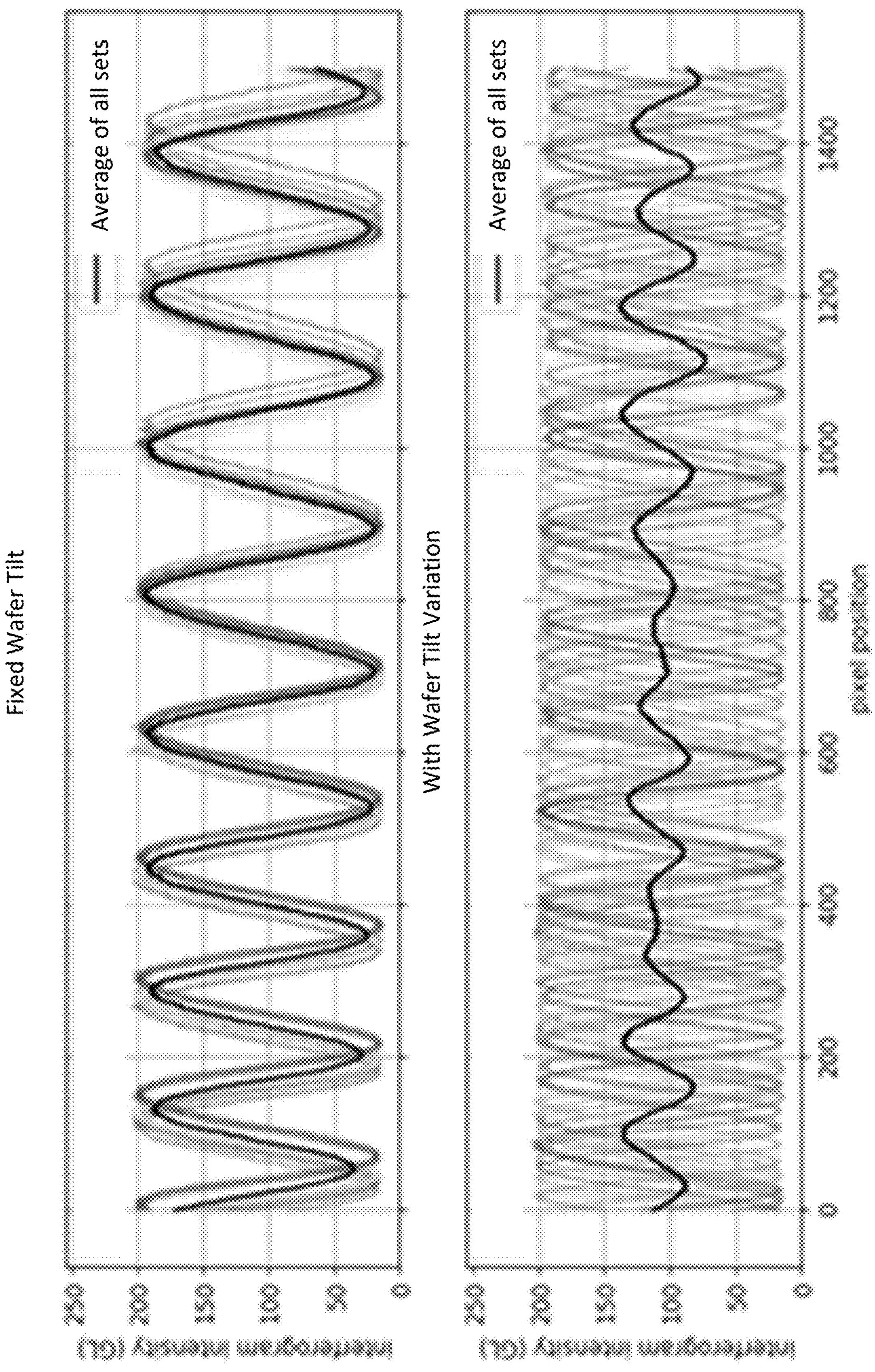
FIG. 10 shows FPT error with fixed workpiece tilt and random workpiece tilt in accordance with the present disclosure.

The processor 20 can average multiple measurements using information received from the detector 40 in FIG. 7. Each of the measurements can have a different position on the stage 52 in two dimensions. The chart of FIG. 10 shows why induced workpiece tilt variation can provide FPT reduction. With fixed workpiece tilt using an averaging method, all interferograms look alike and therefore the subsequent FPT error are similar. Averaging may not reduce the error much. In contrast, with the induced workpiece tilt variation, all interferograms look randomly different. Consequently, their corresponding FPT error also looks different. Therefore, by averaging multiple measurements their FPT error can be more effective canceled.

Figure 11:
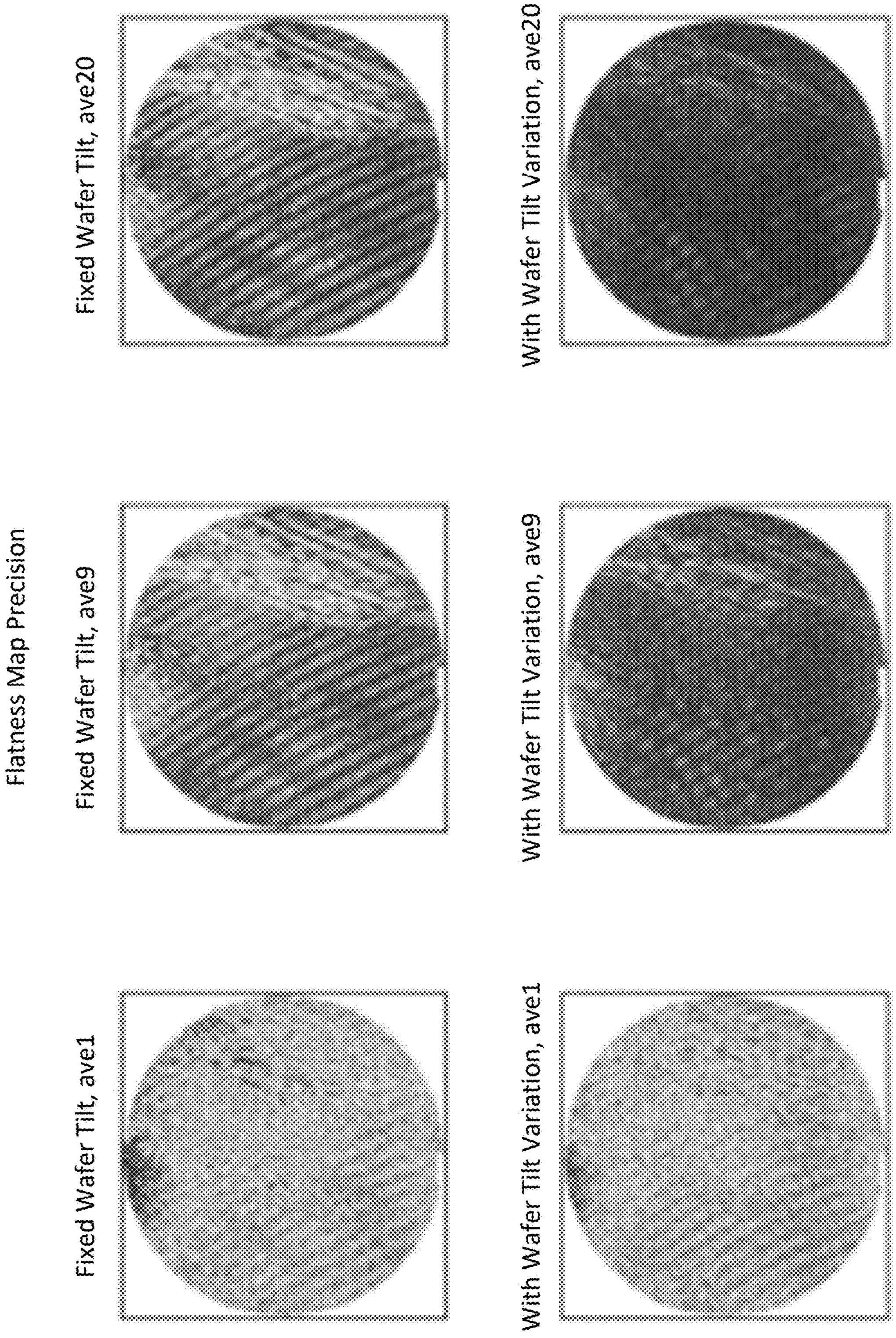
FIG. 11 shows flatness map precision using an embodiment in accordance with the present disclosure.
Figure 12:
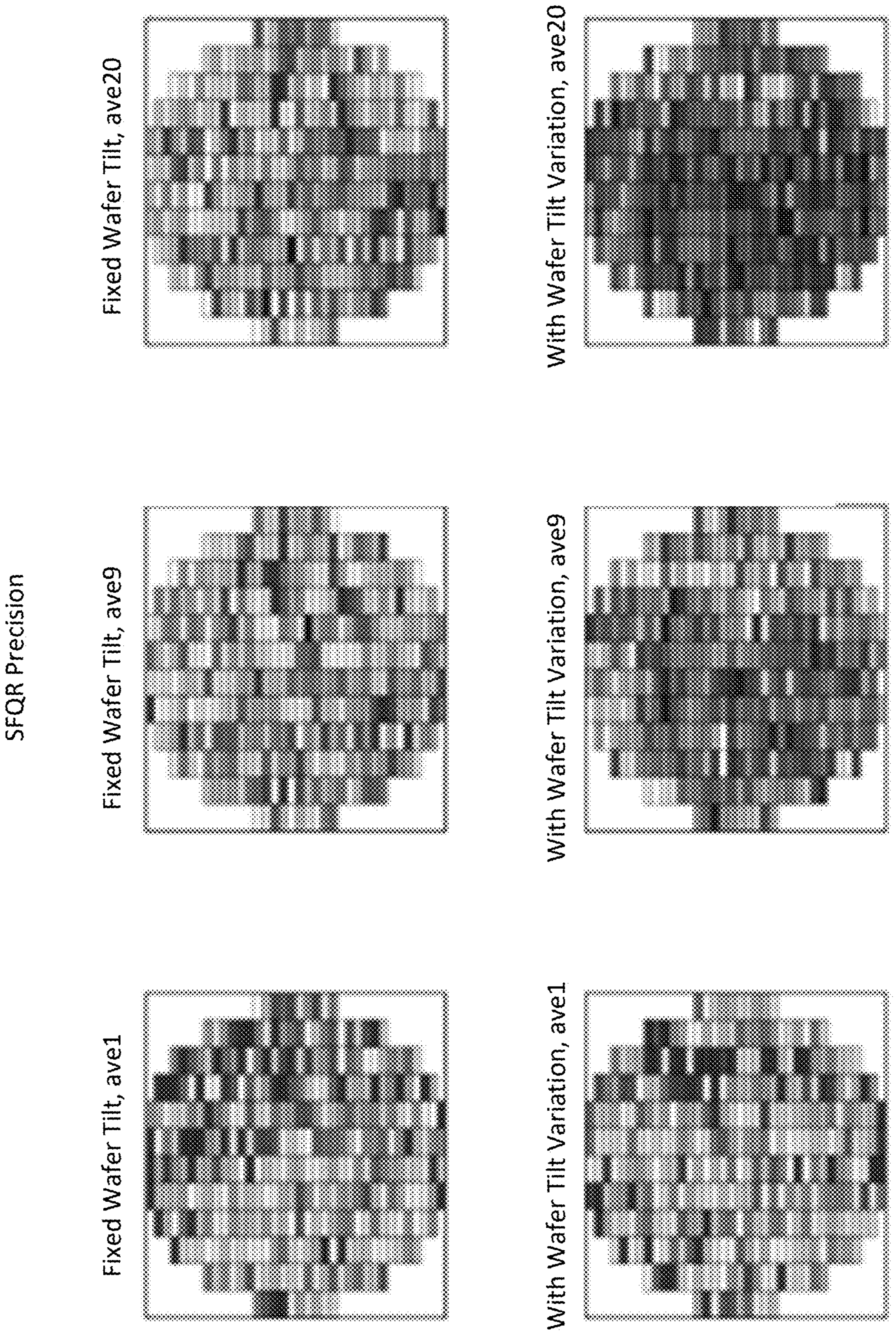
FIG. 12 shows SFQR precision using an embodiment in accordance with the present disclosure.

The plots in FIGS. 11 and 12 show a comparison of thickness map precision and SFQR contour precision. It can be seen at a same number of averaging, a map with workpiece tilt variation shows less noise on both thickness map and SFQR contour. This further demonstrates the effectiveness of the embodiments disclosed herein. The plots of FIGS. 11 and 12 are noise maps of flatness and SFQR. These take five measurements and take standard deviation of a flatness map of processed SFQR. The lower value (darker color more prevalent on ave20, lower noise) the better the precision. From FIG. 11, it can be seen the patterned noise is reduced with wafer tilt variation.

Using embodiments disclosed herein, adding some small random workpiece tilt to each measurement, the interferogram pattern can be randomized. This also can affect the subsequent systematic error. In this manner, the systematic error can be transferred into random error where taking average of multiple measurements becomes more effective to approach the theoretical trend. During operation, a workpiece (e.g., a semiconductor wafer) can be disposed on a stage in an interferometer. Multiple measurements of the workpiece can be taken using the interferometer. A random two-dimensional tilt is applied to the workpiece before each of the measurements using at least one tilt motor. In an instance, two tilt motors are used in conjunction. The resulting measurements can be averaged.

In another embodiment, a non-transitory computer-readable storage medium can include one or more programs for executing the steps on one or more computing devices. In a first step, instructions are sent to at least one tilt motor to apply a random two-dimensional tilt to a stage with a workpiece disposed thereon. In a second step, instructions are sent to measure of the workpiece using an interferometer after the random two-dimensional tilt is applied to the stage.

The first step and the second step are repeated to generate multiple measurements. For example, the first step and the second step can be repeated in an alternating manner. The resulting measurements can be averaged.

In an embodiment, a vibration is added to the stage during measurement. The vibration can add randomness to the position of the workpiece. This can be coupled with the tilt motor(s) or used separately from the tilt motor(s). For example, a subwoofer attached to the measurement chamber can apply a vibration.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An interferometer comprising:

a light source that generates a beam of light;

a beam splitter in a path of the beam of light;

a reference flat in a path of the beam of light from the beam splitter;

a stage configured to hold a workpiece in a path of the beam of light from the beam splitter;

a detector configured to receive light from the workpiece;

a processor in electronic communication with the detector; and a tilt motor connected with the stage, wherein the tilt motor is configured to randomly tilt the stage in two perpendicular dimensions before a measurement.

2. The interferometer of claim 1, further comprising a second tilt motor connected with the stage, wherein the second tilt motor works in conjunction with the tilt motor to randomly tilt the stage in the two perpendicular dimensions before the measurement.

3. The interferometer of claim 1, wherein the processor is configured to average a plurality of measurements of information received from the detector, and wherein each of the measurements uses a different position of the stage in the two dimensions.

4. The interferometer of claim 3, further comprising reducing fringe print-through error based on the measurements.

5. The interferometer of claim 1, wherein the tilt of the workpiece is less than 1 mm.

6. The interferometer of claim 1, wherein the workpiece is a semiconductor wafer.

7. A method comprising:

disposing a workpiece on a stage in an interferometer;

taking a plurality of measurements of the workpiece using the interferometer, wherein a random two-dimensional tilt is applied to the workpiece before each of the measurements using at least one tilt motor.

8. The method of claim 7, wherein the random two-dimensional tilt is applied using two of the tilt motors.

9. The method of claim 7, further comprising averaging the measurements using a processor.

10. The method of claim 9, wherein the two-dimensional tilt is different in each of the measurements thereby reducing fringe print-through error.

11. The method of claim 7, wherein a tilt of the workpiece is less than 1 mm.

12. The method of claim 7, wherein the workpiece is a semiconductor wafer.

13. A non-transitory computer-readable storage medium, comprising one or more programs for executing the following steps on one or more computing devices comprising:

in a first step, sending instructions to at least one tilt motor to apply a random two-dimensional tilt to a stage with a workpiece disposed thereon;

in a second step, sending instructions to measure the workpiece using an interferometer after the random two-dimensional tilt is applied to the stage;

repeating the first step and the second step to generate a plurality of the measurements.

14. The non-transitory computer-readable storage medium of claim 13, wherein the steps further include averaging the measurements.

15. The non-transitory computer-readable storage medium of claim 13, wherein the first step further includes sending instructions to a second tilt motor to apply the random two-dimensional tilt.

16. The non-transitory computer-readable storage medium of claim 13, wherein a tilt of the workpiece is less than 1 mm.

17. The non-transitory computer-readable storage medium of claim 13, wherein the workpiece is a semiconductor wafer.

18. The non-transitory computer-readable storage medium of claim 13, wherein the two-dimensional tilt is different in each of the measurements thereby reducing fringe print-through error.

* * * * *